(12) United States Patent
Morton

(10) Patent No.: US 10,117,364 B2
(45) Date of Patent: Oct. 30, 2018

(54) DISPLAY DEVICE WITH OPTICALLY CLEAR FLUID DISPOSED BETWEEN DISPLAY PANEL AND DISPLAY COVER

(71) Applicant: Display Logic USA Inc., Mineola, NY (US)

(72) Inventor: Keith Morton, Smithown, NY (US)

(73) Assignee: DISPLAY LOGIC USA INC., Mineola, NY (US)

( * ) Notice: Subject to any disclaimer, the term of this patent is extended or adjusted under 35 U.S.C. 154(b) by 139 days.

(21) Appl. No.: 15/160,724

(22) Filed: May 20, 2016

(65) Prior Publication Data

US 2017/0231121 A1    Aug. 10, 2017

Related U.S. Application Data

(60) Provisional application No. 62/292,351, filed on Feb. 7, 2016.

(51) Int. Cl.
*H05K 7/20* (2006.01)
*G02F 1/13* (2006.01)
*G02F 1/1333* (2006.01)

(52) U.S. Cl.
CPC ... *H05K 7/20981* (2013.01); *G02F 1/133385* (2013.01); *H05K 7/20272* (2013.01); *H05K 7/20281* (2013.01); *H05K 7/20963* (2013.01)

(58) Field of Classification Search
CPC .......... H05K 7/20981; H05K 7/20963; H05K 7/20281; H05K 7/20272; G02F 1/133385; G02F 1/133603; G02F 1/1341; G02F 1/133308; G02F 1/133615; G02F 1/1368; G02F 1/133514; G02F 2001/13415; G02F 1/133512; G02F 1/133608; G02F 1/13452; G02F 1/136286; G02F 2001/13338

See application file for complete search history.

(56) References Cited

U.S. PATENT DOCUMENTS

| 4,651,047 A | 3/1987 | Comberg et al. |
| 4,665,336 A | 5/1987 | Howden |
| 4,775,817 A | 10/1988 | Duwaer et al. |

(Continued)

FOREIGN PATENT DOCUMENTS

WO  PCT/US2016/033569    8/2016

OTHER PUBLICATIONS

Touch International, "What is the difference between liquid optical bonding and dry optical optical bonding?" http://touchinternational.com/bonding-difference/, Sep. 2013, pp. 1-4.

(Continued)

*Primary Examiner* — Adam B Dravininkas
(74) *Attorney, Agent, or Firm* — Ryan, Mason & Lewis, LLP

(57) ABSTRACT

Display devices, methods for fabricating display devices, and display systems are provided. For example, a display device comprises a display panel, a display cover bonded to a perimeter of the display panel with a perimeter seal, and an optically clear fluid disposed in a gap between the display panel and the display cover. The optically clear fluid has an index of refraction that is substantially matched to an index of refraction of the display cover. The optically clear fluid may comprise oil, alcohol, water, or a liquid gel, for example.

20 Claims, 6 Drawing Sheets

(56) References Cited

U.S. PATENT DOCUMENTS

| | | | |
|---|---|---|---|
| 5,137,484 A * | 8/1992 | Bohannon | G02F 1/1335 |
| | | | 141/7 |
| 5,332,238 A * | 7/1994 | Borucki | G06F 3/043 |
| | | | 277/654 |
| 5,514,595 A * | 5/1996 | Olds | G01N 1/42 |
| | | | 422/82.09 |
| 5,682,077 A | 10/1997 | Hanssen et al. | |
| 6,572,830 B1 * | 6/2003 | Burdon | F04B 19/006 |
| | | | 156/89.11 |
| 6,942,018 B2 * | 9/2005 | Goodson | F04B 19/006 |
| | | | 165/104.21 |
| 8,462,301 B2 | 6/2013 | O'Donnell | |
| 2003/0011983 A1 | 1/2003 | Chu et al. | |
| 2004/0046909 A1 * | 3/2004 | Sekiguchi | G02F 1/1345 |
| | | | 349/113 |
| 2006/0238868 A1 * | 10/2006 | Dube | G02F 1/0147 |
| | | | 359/489.04 |
| 2007/0046874 A1 * | 3/2007 | Adachi | G02F 1/133308 |
| | | | 349/122 |
| 2009/0087640 A1 | 4/2009 | Li et al. | |
| 2010/0194675 A1 | 8/2010 | Yoshida et al. | |
| 2010/0232000 A1 * | 9/2010 | Futterer | G02B 26/005 |
| | | | 359/9 |
| 2012/0155230 A1 | 6/2012 | Patt | |
| 2012/0234459 A1 | 9/2012 | Nally et al. | |
| 2013/0034713 A1 * | 2/2013 | Busman | G02B 1/04 |
| | | | 428/217 |
| 2014/0043291 A1 * | 2/2014 | Ciesla | G06F 3/016 |
| | | | 345/174 |
| 2014/0120315 A1 * | 5/2014 | Aitken | B32B 17/06 |
| | | | 428/142 |
| 2014/0240615 A1 * | 8/2014 | Allore | B29C 45/14311 |
| | | | 349/12 |
| 2014/0285424 A1 * | 9/2014 | Yairi | G06F 3/044 |
| | | | 345/156 |
| 2014/0339741 A1 * | 11/2014 | Aghababaie | B33Y 30/00 |
| | | | 264/401 |
| 2014/0360214 A1 | 12/2014 | Tansley | |
| 2015/0029658 A1 * | 1/2015 | Yairi | G06F 1/20 |
| | | | 361/679.47 |
| 2016/0238877 A1 * | 8/2016 | Wagner | G02F 1/133308 |
| 2016/0259465 A1 * | 9/2016 | Agarwal | G06F 3/0414 |
| 2017/0054105 A1 * | 2/2017 | Alonso | G02B 5/3033 |

OTHER PUBLICATIONS

Bahadur, B., Sampica, J. D., Tchon, J. L. and Butterfield, A. (2011), Direct dry film optical bonding—A low-cost, robust, and scalable display lamination technology. Journal of the Society for Information Display, 19: 732-740.

* cited by examiner

DISPLAY DEVICE WITH OPTICALLY CLEAR FLUID DISPOSED BETWEEN DISPLAY PANEL AND DISPLAY COVER

CROSS-REFERENCE TO RELATED APPLICATION

This application claims priority to U.S. Provisional Patent Application Ser. No. 62/292,351, filed on Feb. 7, 2016, the disclosure of which is incorporated herein by reference.

TECHNICAL FIELD

The present disclosure relates to display devices and methods for fabricating display devices.

BACKGROUND

Various techniques have been developed to fabricate a display device with a display cover bonded to a display panel. In one conventional technique, the display cover is bonded to a perimeter of the display panel using an adhesive material, while leaving an air gap between the display cover and the display panel. With this design, the air gap between the display cover and the display panel significantly reduces the optical performance of the display device due to the refractive index mismatch at the interface between the display cover and the air gap. For example, a display cover made of glass has an index of refraction of about 1.5, wherein air has an index of refraction of about 1.0. This mismatch in the refractive index results in increased parasitic reflections at the interface between the display cover and air gap, which reduces the display contrast ratio and, thus degrades viewability. In addition, condensation can form in the air gap between the display panel and the display cover, which can further degrade the optical performance of the display device.

Other conventional techniques include liquid bonding and dry film bonding techniques, which serve to eliminate the air gap by bonding a display cover to a display panel using a bonding material that has a refractive index which is matched to the display cover. For example, with liquid bonding techniques, a liquid adhesive material such as epoxy, silicon or urethane, is applied between the display panel and the display cover. The liquid adhesive material is then cured/hardened through UV (ultraviolet light), heat, moisture, or a combination thereof (depending on the type of liquid adhesive material used) to bond the display cover and the display panel together. Furthermore, dry bonding techniques generally include the use of a non-liquid optical tape, or disposing a thin laminate sheet of optical material (e.g., optical thermoplastic material) between the display panel and the display cover and applying a suitable temperature and pressure which causes the thin laminate sheet of optical material to adhere to the display panel and display cover.

While liquid and dry bonding techniques improve optical performance of the display device by replacing the air gap with a material having a matching refractive index, the optical performance of display devices constructed using such techniques can degrade over time as a result of delamination at the interfaces of the bonded components. Indeed, a delamination can occur as a result of mechanical stresses that are applied at the interfaces between the different bonded components. These mechanical stress can result from repeated shock or vibration applied to the display device, or shear stresses that are applied at the interfaces between the bonded components of the display device due to different rates of thermal expansion of the different materials of the bonded components. In addition, delamination can result due to uneven mounting pressure, altitude or other environmental or mechanical issues. The delamination at the interface(s) of the bonded components can cause significant visual anomalies and luminance irregularities of the display device, thereby degrading the optical performance of the display device.

SUMMARY

Embodiments of the invention include display devices, methods for fabricating display devices, and display systems. For example, one embodiment includes a display device. The display device comprises a display panel, a display cover bonded to a perimeter of the display panel with a perimeter seal, and an optically clear fluid disposed in a gap between the display panel and the display cover. In one embodiment, the optically clear fluid has an index of refraction that is substantially matched to an index of refraction of the display cover. The optically clear fluid may comprise oil, alcohol, water, or a liquid gel, for example.

Another embodiment includes a method for fabricating a display device. The method includes applying a sealing material around a perimeter of a display panel, bonding a display cover to the display panel using the sealing material, wherein the bonding results in the formation of a gap between the display panel and the display cover, and filling the gap between the display panel and the display cover with an optically clear fluid. In one embodiment, filling the gap comprises injecting the optically clear fluid into the gap between the display panel and the display cover through a tube that is disposed in the sealing material.

Another embodiment includes a display system. The display system comprises a display device that comprises a display panel, a display cover bonded to a perimeter of the display panel with a perimeter seal, and an optically clear fluid disposed in a gap between the display panel and the display cover. The display system further includes a temperature control system comprising a temperature control module. The temperature control system is coupled to the display device and is configured to circulate the optically clear fluid of the display device through the temperature control module to control a temperature of the display device.

Other embodiments will be described in the following detailed description of illustrative embodiments, which is to be read in conjunction with the accompanying drawings.

DETAILED DESCRIPTION

Embodiments of the invention will now be described in further detail with regard to display devices, methods for fabricating display devices, and display systems comprising temperature control mechanisms. It is to be understood that the various layers, structures, and components shown in the accompanying drawings are schematic illustrations that are not drawn to scale. In addition, for ease of explanation, one or more layers, structures, and components of a type commonly used to fabricate display devices may not be explicitly shown in a given drawing. This does not imply that any layers, structures, and components not explicitly shown are omitted from embodiments of display devices as discussed herein. Furthermore, with respect to fabrication techniques as discussed herein, it is to be emphasized that the descriptions provided herein are not intended to encompass all standard fabrication steps that may be performed to fabricate a display device. Rather, certain fabrication steps that are commonly used in building display devices are purposefully not described herein for economy of description.

Moreover, the same reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1:
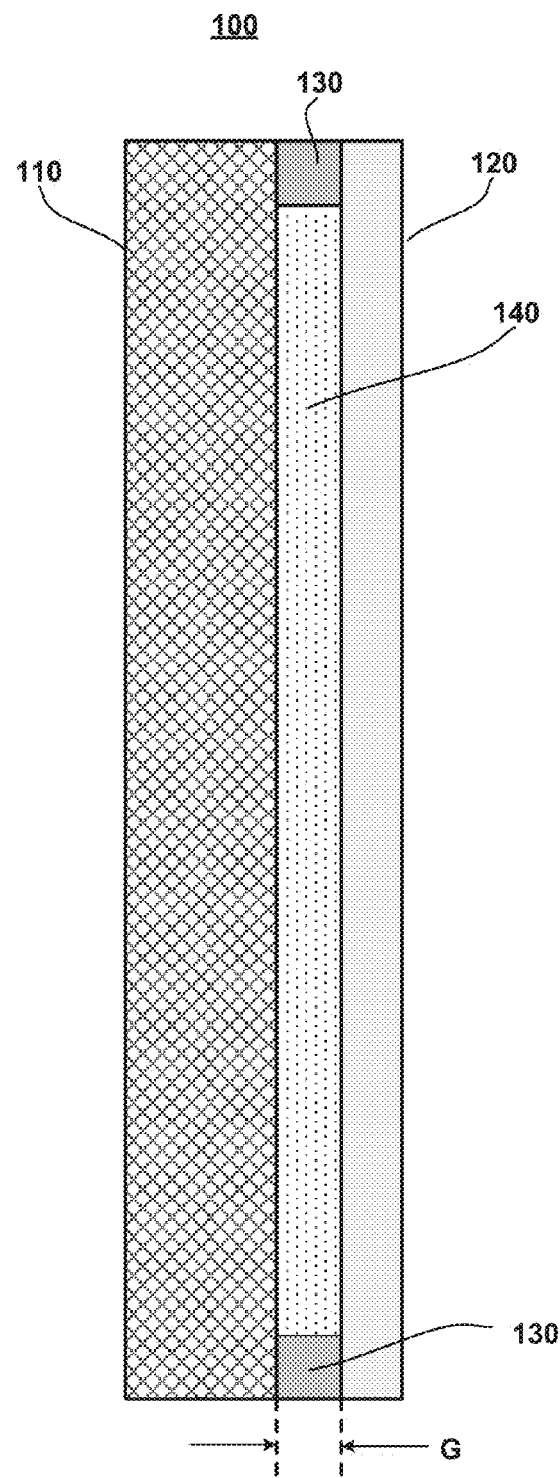
FIG. 1 is a schematic side view of a display device having an optically clear fluid disposed between a display panel and a display cover, according to an embodiment of the invention.

FIG. 1 is a schematic side view of a display device 100 according to an embodiment of the invention. The display device 100 comprises a display panel 110, a display cover 120, a perimeter seal 130, and an optically clear fluid 140 disposed in a gap G between the display panel 110 and the display cover 120. Depending on the application, the gap G may be in a range of about 0.1 mm to about 1 inch. The display panel 110 may comprise any type of display panel technology including, but not limited to, a backlit transmissive passive display panel such as a LCD (Liquid Crystal Display) panel, or a light generating active display panel such as an OLED (Organic Light-Emitting Diode) display panel, etc.

The display cover 120 can be formed of any suitable optically transparent material that is commonly used for display covers of display devices including, but not limited to, glass or polymer plastics (e.g., clear polycarbonate, clear acrylic), or other types of optically clear thermoplastic polymer materials. The display cover 120 may comprise an AR (antireflective) coating to minimize external reflection of ambient light. In another embodiment, the display cover 120 may comprise a touch-sensitive layer to implement touchscreen display functionality for certain applications.

In accordance with embodiments of the invention, the optically clear fluid 140 comprises a non-gaseous fluid material (e.g., a liquid, oil, alcohol, or liquid gel) that remains in a fluid state during operation of the display device 100 (i.e., the optically clear fluid is not cured or converted to a solid state) and which has an index of refraction that is substantially matched to an index of refraction of the material of the display cover 120. In other words, the optically clear fluid 140 remains in a fluid state during normal operation of the display device 100 to provide a function of index refraction matching, for example, but the optically clear fluid 140 does not function to bond the display cover 120 to the display panel 110. Instead, the bonding of the display cover 120 to the display panel 110 is achieved using the perimeter seal 130.

The term "optically clear fluid" is meant to broadly denote a non-gaseous fluid that has a percentage of light transmission (in the visible spectrum) in a range of about 70% to about 100%, so that the optically clear fluid 140 within the gap G between the display panel 110 and the display cover 120 is essentially transparent, clear, or minimally translucent (but not opaque) in the visible light spectrum. In addition, in one embodiment of the invention, type of material that is used for the optically clear fluid 140 is substantially colorless and has a haze percentage of less than about 1%. As is known in the art, haze is a measure of scattering that is calculated by a ratio of diffuse transmission and total transmission through a medium, where diffuse transmission is a measure of an amount of light that is scattered while passing through a medium.

In accordance with embodiments of the invention, the optically clear fluid 140 can be, for example, poly-methyl stilbenemethacrylate (PMMS), a silicon oil (e.g., a liquid polymerized siloxane such as polydimethylsiloxane (PDMS)), mineral oil (e.g., propylene glycol), ethanol (ethyl alcohol) or other types of alcohols, ethylene glycol, water, a liquid gel (e.g., a silicone gel material comprising a soft, moderately cross-linked silicone polymer), etc. Silicon oils have an index of refraction in a range of about 1.336 to about 1.582. Mineral oils have an index of refraction in range of about 1.462 to about 1.47. Ethanol has an index of refraction of about 1.361. Water has an index of refraction of about 1.33. The exemplary fluid materials listed above each have an index of refraction which substantially matches the index of refraction of the display cover 120 when made of glass, for example, wherein glass materials have an index of refraction of about 1.5.

The display cover 120 is bonded to the display panel 110 using the perimeter seal 130. The perimeter seal 130 may include any suitable bonding material that is commonly used for bonding display covers to display panels. For example, the perimeter seal 130 may comprise a silicon seal, a polyurethane seal, a foam tape seal, etc. While various types of sealing materials can be used for the perimeter seal 130, the sealing material used should not be reactive with the optically clear fluid 140. This is to prevent degradation of the perimeter seal 130 over time, and avoid potential failure of the perimeter seal 130, which can result in leakage of the optically clear fluid 140 from the display device 100. For example, if a silicon oil is used as the optically clear fluid 140, then the perimeter seal 130 can be formed using a urethane adhesive (as compared to a silicon adhesive which would react with the silicon oil).

The optically clear fluid 140 serves multiple purposes. For example, the optically clear fluid 140 serves to fill the gap G with a fluid material that provides optical refractive index matching with the material of the front display cover 120. The optical refractive index matching serves to minimize or eliminate internal specular reflection of light that is incident at the interface between the optically clear fluid 140 and the display cover 120, to thereby increase the contrast ratio of the display device 100. It is known that specular reflection of light may occur whenever light travels from one medium with a given refractive index into another medium with a different refractive index. As noted above, with conventional designs in which an air gap exists between the display panel and the display cover, the air gap causes a significant mismatch in the optical refractive index at the interface between the air gap and the display cover which, consequently, degrades the performance of the display device.

Furthermore, since the optically clear fluid 140 remains in a fluid state during the use and operation of the display device 100, there is no risk of performance degradation due to delamination or decoupling of optically matched layers of the display device 100, as in conventional display devices that are fabricated using liquid bonding or dry bonding techniques. Indeed, while the optically clear fluid 140 is utilized for optical refractive index matching, the optically clear fluid 140 is not utilized to mechanically bond the display cover 120 to the surface of the display panel 110. In this regard, the optical interfaces between the display cover 120 and the optically clear fluid 140, and between the optically clear fluid 140 and the display panel 110, remain intact over the life of the display device 100, as such interfaces cannot physically delaminate to cause visual anomalies or luminance irregularities (as compared to conventional devices where liquid or dry bonded layers in the display device will delaminate under certain conditions).

In another embodiment of the invention, the optically clear fluid 140 is utilized to thermally cool and/or thermally heat the display device 100 in applications where the display device is deployed in outdoor environments, for example, with vast changes in temperature. As explained in further detail below with reference to FIG. 3, for example, the optically clear fluid 140 can be circulated through a closed system which comprise a heating module or a cooling module (or both) to keep the display device warm or cool. For example, the display device 100 may be an outdoor LCD sign or part of an outdoor kiosk (e.g., ATM machine) that is subjected to heating due to direct incident sunlight shining on the display device 100 and/or high ambient temperatures. In such applications, the optically clear fluid 140 can be circulated through a cooling module to cool down the optically clear fluid 140 and, thus, prevent the display device 100 from overheating. In addition, the display device 100 may be subjected to extremely cold ambient temperatures. In such applications, the optically clear fluid 140 can be circulated through a heating module to heat up the optically clear fluid and, thus, keep the display device at a desired operating temperature and prevent the display device from being subjected to freezing temperatures. For heating/cooling applications, the gap size G between the display cover 120 and the display panel 110 can be relatively large (as compared to non-cooling/heating applications) to ensure proper fluid flow across the surface area of the display device 100, and to provide a sufficient volume of optically clear fluid 140 between the display panel 110 and display cover 120 to obtain desired thermal properties for heating/cooling the display device 100.

Figure 2:
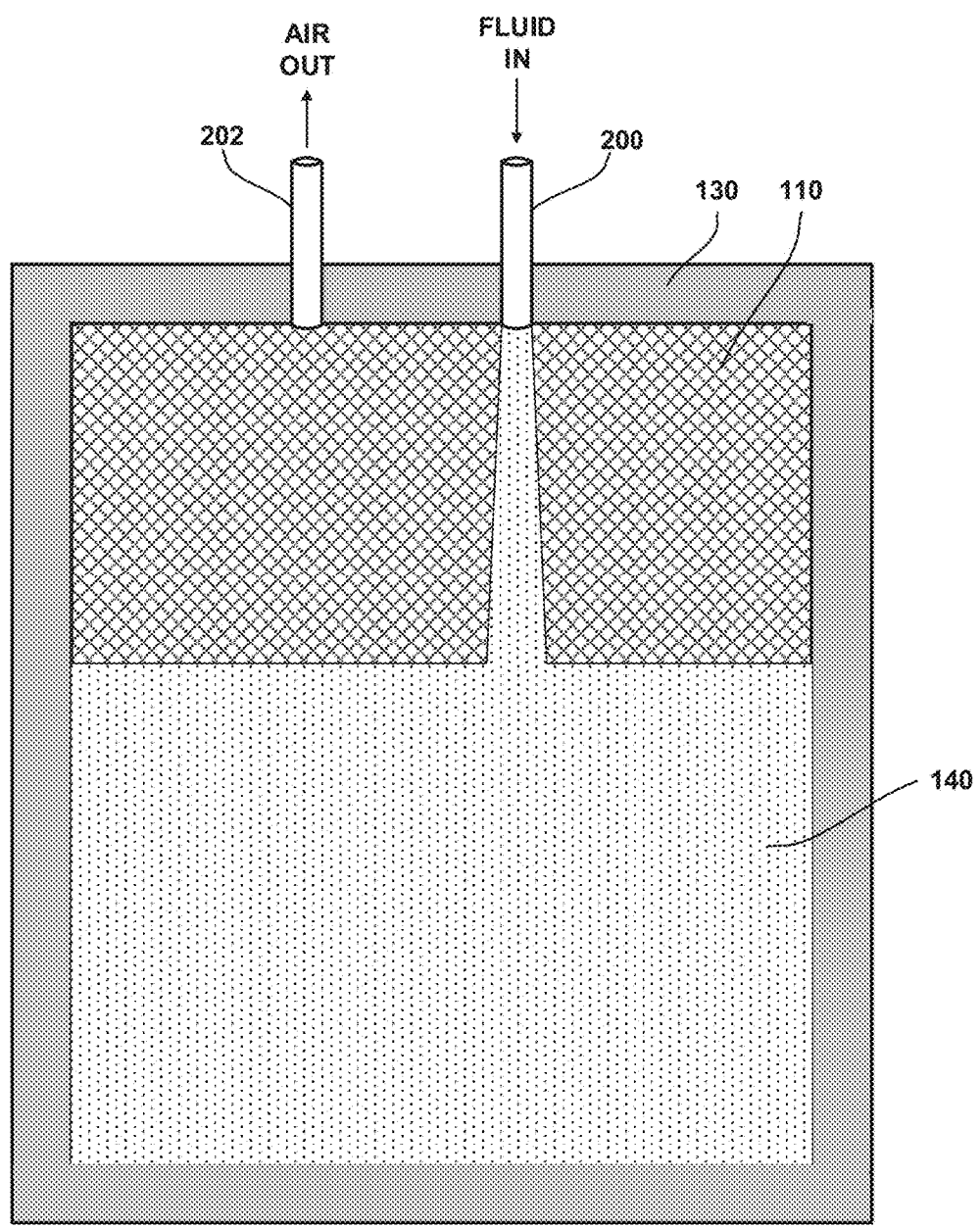
FIG. 2 schematically illustrates a method for filling a gap between a display panel and a display cover of a display device with an optically clear fluid, according to an embodiment of the invention.

Various methods can be implemented to fabricate a display device having an optically clear fluid disposed between a display panel and a display cover, according to embodiments of the invention. For example, FIG. 2 schematically illustrates a method for filling the gap G between the display panel 110 and the display cover 120 of the display device 100 with an optically clear fluid 140, according to an embodiment of the invention. In particular, FIG. 2 illustrates a fabrication method which begins with bonding the display cover 120 to the display panel 110 using the perimeter seal 130. In FIG. 2, the display cover 120 is optically transparent and is thus, not specifically illustrated in FIG. 2. During this process, a plurality of tubes 200 and 202 are disposed in the material of the perimeter seal 130, which enables the gap G between the display panel 110 and the display cover 120 to be injection filled with the optically clear fluid 140. The material of the perimeter seal 130 can be applied to the perimeter of the display panel 110 either by hand, or by using a standard XYZ dispensing machine which is commonly used in fabrication of display devices.

After the display cover 120 is bonded to the display panel 110, as schematically illustrated in FIG. 2, an optically clear fluid 140 is injected through one of the tubes (e.g., tube 200) to fill the gap G between the display cover 120 and the display panel 110. The optically clear fluid 140 can be injected through the tube 200 by various methods, including, but not limited to, pouring the optically clear fluid 140 into the gap through the tube 200 (gravity pour fill), injecting the optically clear fluid 140 through the tube 200 using a syringe device connected to the tube 200, or using some other form of pumping device to pump the optically clear fluid 140 through the tube 200 into the gap G between the display cover 120 and the display panel 110. While the optically clear fluid 140 fills the gap G, air is bled out from the other tube 202. Once the gap G is sufficiently filled with the optically clear fluid 140, the tubes 200 and 202 can be removed or otherwise cut to remove the protruding portions of the tubes 200 202, and then the remaining openings are filled with additional sealing material.

The method used to fill the display device 100 with the optically clear fluid 140 will vary depending on factors such as the size (thickness) of the gap G and square area of the display device 100 (i.e., the magnitude of the empty volume to be filled with the fluid), and the viscosity of the optically clear fluid 140. Whatever method is utilized, the optically clear fluid 140 that fills the gap G should be free of air bubbles.

In another embodiment of the invention, in instances where the optically clear fluid 140 is not utilized for cooling and/or heating the display device 100, the gap G between the display panel 110 and display cover 120 can be made very small (e.g., 0.10 mm). When the gap G is small (and when the surface area of the display device is relatively small), several drops of the optically clear fluid 140 can be placed on the surface of the display panel 110 in a central region of the display panel 110 within the perimeter seal 130. The display cover 120 is then pressed down against the surface of the display panel 110 to bond the display cover 120 to the display panel 110 and thereby compress and spread the optically clear fluid 140 to fill the gap G. In this process, the perimeter seal 130 can be initially applied with a small discontinuity (void) that allows air and/or excessive fluid to bleed out from side of the display device 100 through the void in the perimeter seal 130. Thereafter, the void can be filled with additional sealing material.

Figure 3:
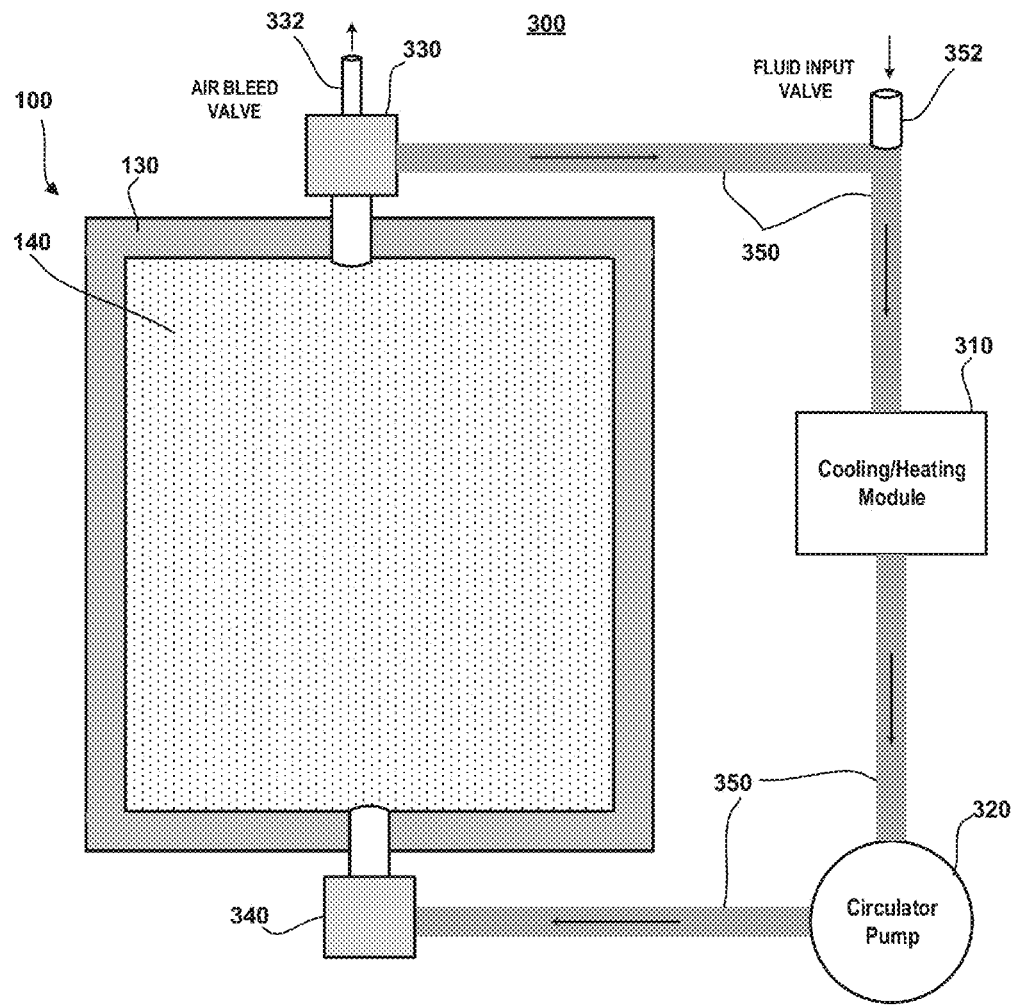
FIG. 3 schematically illustrates a system for fluid cooling and/or heating a display device according to an embodiment of the invention.

As noted above, the optically clear fluid 140 can be utilized to thermally cool and/or thermally heat the display device 100 in applications where the display device is deployed, e.g., in outdoor environments or other environments with vast changes in temperature. For example, FIG. 3 schematically illustrates a display system 300 for fluid cooling and/or heating a display device according to an embodiment of the invention. The display system 300 comprises a display device 100 (having components as shown in FIG. 1), and a temperature control system comprising a temperature control module 310 (alternatively, cooling/heating module), wherein the temperature control system is coupled to the display device 100 and is configured to circulate the optically clear fluid 140 of the display device 100 through the temperature control module 310 to control a temperature of the display device 100.

The temperature control system further comprises a circulator pump 320, fluid input/output connectors 330 and 340 coupled to the display device 100, and a piping system 350 coupled to the fluid input/output connectors 330/340, the circulator 320, and the temperature control module 310. The circulator pump 320 is configured to circulate the optically clear fluid 140 through the piping system 350, the display device 100, and through the temperature control module 310 to heat or cool the optically clear fluid 140.

In one embodiment, for cooling application, the temperature control module 310 may be a passive radiating device which serves as a heat sink that is configured to absorb and dissipate thermal energy of the optically clear fluid 140. To enhance cooling, a fan can be used to blow air at the heat sink to increase the thermal dissipation rate. In another embodiment, the temperature control module 310 may comprise an active cooling/heating module which utilizes thermoelectric (TE) techniques for cooling and/or cooling the optically clear fluid 140, depending on the application and the anticipated temperature range that the display device 100 will be subjected to. As is known in the art, a thermoelectric device is a solid-state device which utilizes the Peltier effect to generate a thermal flux between the junction of two different types of materials, depending on a direction of DC current through the device. The TE device has two sides, and when DC current flows through the device, one side is heated and the other side is cooled. In this regard, a TE-based cooling/heating module 310 can be designed such that the circulating optically clear fluid 140 is thermally coupled to one side of the TE device to either cool the fluid or heat the fluid 140, depending on the operation mode of the TE-based cooling/heating module 310.

As further shown in FIG. 3, the optically clear fluid 140 can be injected into the display system using, for example, a fluid input valve 352 connected at some point along the network of piping 350, and an air bleed valve 332 that is part of the connector 330. In this regard, the display system 300 can be assembled by connecting the temperature control system to the display device (e.g., connecting the piping 350 to display device 100 via the connectors 330/340), and then injecting the optically clear fluid into the closed system via the fluid input valve 352. When injecting the optically clear fluid 140 into the system, the air bleed valve 332 can be used to bleed the air out of the closed piping system, thereby ensuring that no air bubbles or air pockets exist within the optically clear fluid 140 that flows through the display device 100.

It is to be understood that FIG. 3 is a high-level schematic illustration of a method for cooling/heating a display device. In this regard, while only one pair of fluid input/output connectors 330/340 is shown for ease of illustration, in other embodiments of the invention, a display device may comprise additional fluid input/output connectors and/or custom-designed fluid I/O manifolds, which are arranged and configured to ensure an even flow of fluid across the area of the display device. The number/arrangement of fluid I/O connectors or the configuration/arrangement of the fluid I/O manifolds will vary depending on various factors such as the size of the display device. In addition, the display system 300 may comprise a temperature sensor to monitor the temperature of the optically clear fluid 140, and a control system which controls the cooling/heating module 310 and circulator pump 320 based on the temperature readings of the temperature sensor. For example, if a given temperature sensor reading indicates that a temperature of the optically clear fluid 140 exceeds a threshold, the control system can send control signals to the cooling/heating module 310 to increase the amount of active cooling and/or send control signals to the circulator pump 320 to adjust the flow rate of the optically clear fluid 140 as needed to enhance the cooling capability of the system.

In other embodiments of the invention, as discussed in further detail below with reference to FIGS. 4, 5 and 6, a display device can be fabricated with a mechanism to accommodate (e.g., counteract) thermal expansion of the optically clear fluid. In certain application, thermal expansion of the optically clear fluid 140 within the display device 100 can occur as a result in an increase in temperature of the optically clear fluid 140 due to thermal energy generated by active components of the display device 100 and/or an increase in ambient temperature. These techniques can be applied in instances where the type of optically clear fluid that is used has a positive coefficient of thermal expansion (e.g., the volume of the optically clear fluid increases with increased temperature). In such instances, the thermal expansion (e.g., increase in volume) of the optically clear fluid 140 (in a closed volume within the display device 100) can result in mechanical forces being applied to the perimeter seal 130, thereby causing degradation or failure at some point along the perimeter seal 130, which can result in leakage of the optically clear fluid 140 out of the display device 100. In addition, the mechanical forces applied to the display panel 110 as a result of thermal expansion of the optically clear fluid 140 (in the closed volume) can result in visual anomalies and luminance irregularities of the display device 100, thereby degrading the optical performance of the display device 100.

Figure 4:
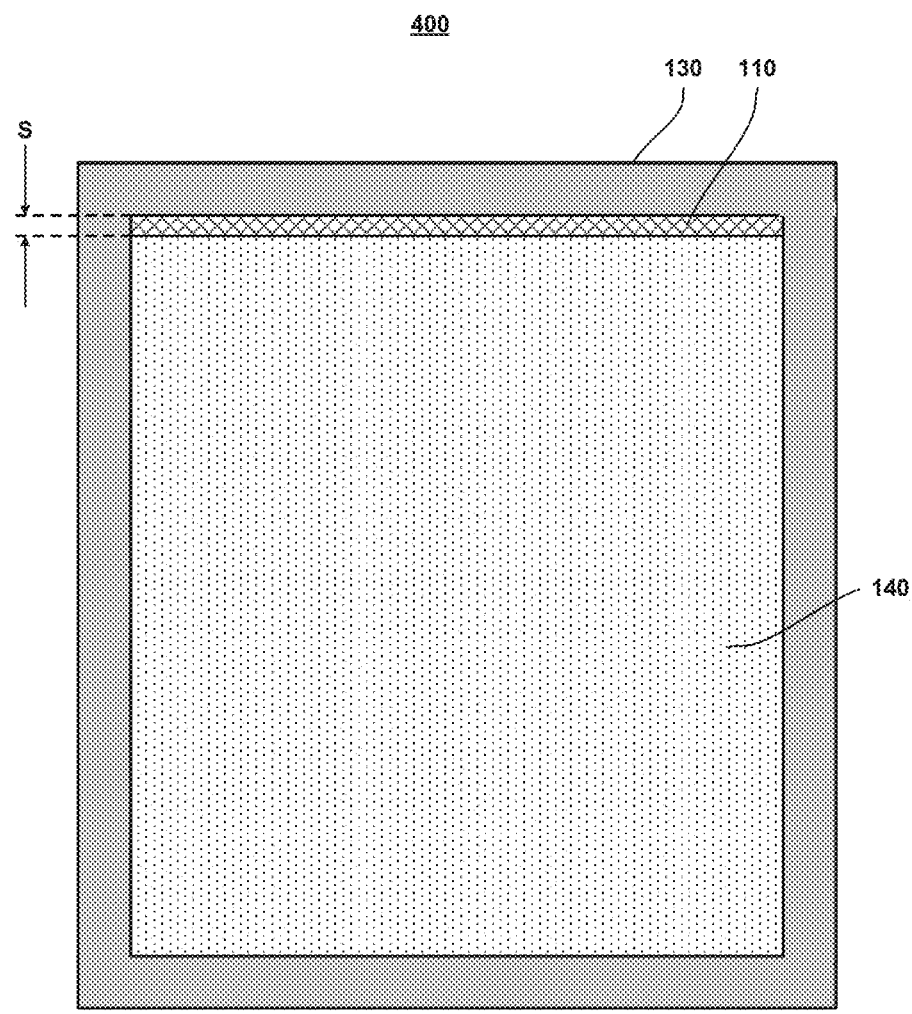
FIG. 4 schematically illustrates a method for accommodating thermal expansion of an optically clear fluid of a display device, according to an embodiment of the invention.

FIG. 4 schematically illustrates a method for accommodating thermal expansion of an optically clear fluid of a display device, according to an embodiment of the invention. In particular, FIG. 4 shows a display device 400 comprising an optically clear fluid 140 disposed in the closed volume between the display cover, the display panel 110 and the perimeter seal 130, but wherein a small space S exists (within the closed volume) at the top of the display device 400 to accommodate thermal expansion of the optically clear fluid 140. In other words, in this embodiment, the closed volume within the display device is not completely filled with the optically clear fluid 140, but rather a small volume of air is left at the top of the display device 400 (outside the viewing area of the display device 400) to provide space for thermal expansion of the optically clear fluid 140.

Figure 5:
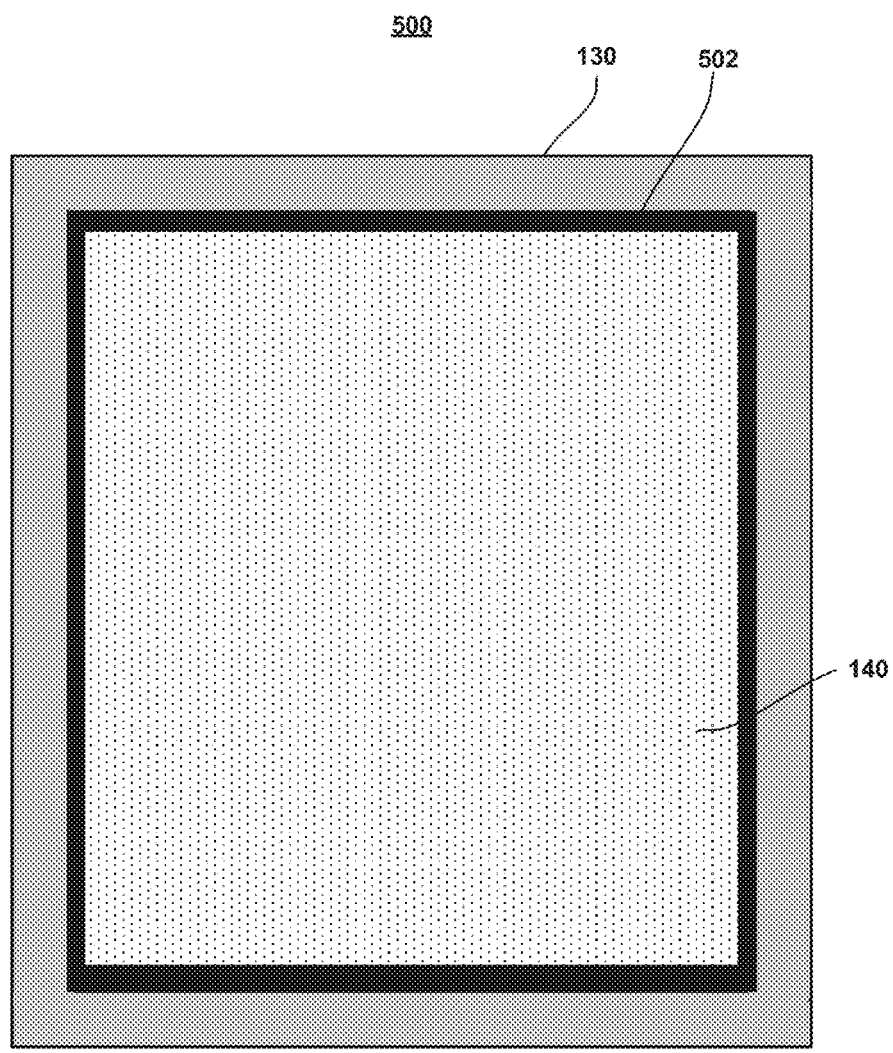
FIG. 5 schematically illustrates a method for accommodating thermal expansion of an optically clear fluid of a display device, according to another embodiment of the invention.

FIG. 5 schematically illustrates a method for accommodating thermal expansion of an optically clear fluid of a display device, according to another embodiment of the invention. In particular, FIG. 5 shows a display device 500 comprising an optically clear fluid 140 that completely fills the closed volume between the display cover and the display panel and the perimeter seal 130, but wherein a volume expansion member 502 is disposed around the inner perimeter of the perimeter seal 130. The volume expansion member 502 comprises a material is configured to be crushed and decrease in volume in response to mechanical forces applied to the volume expansion member 502 by the thermal expansion of the volume of the optically clear fluid 140. In one embodiment, the volume expansion member 502 comprises a closed cell foam material that does not absorb or otherwise react with the optically clear fluid 140.

While the example embodiment of FIG. 5 shows the volume expansion member 502 disposed around the inner perimeter of the entire perimeter seal 130, in other embodiments of the invention, the volume expansion member 502 can be disposed on one side, or less than all sides, or along a portion of one side of the perimeter seal 130. In all instances, the volume expansion member 502 is disposed outside the viewing area of the display device 500. The amount of volume that is occupied by the volume expansion member 502 will vary depending on factors such as the CTE (coefficient of thermal expansion) value of the optically clear fluid 140 and the anticipated temperature range of operation of the display device 500.

Figure 6:
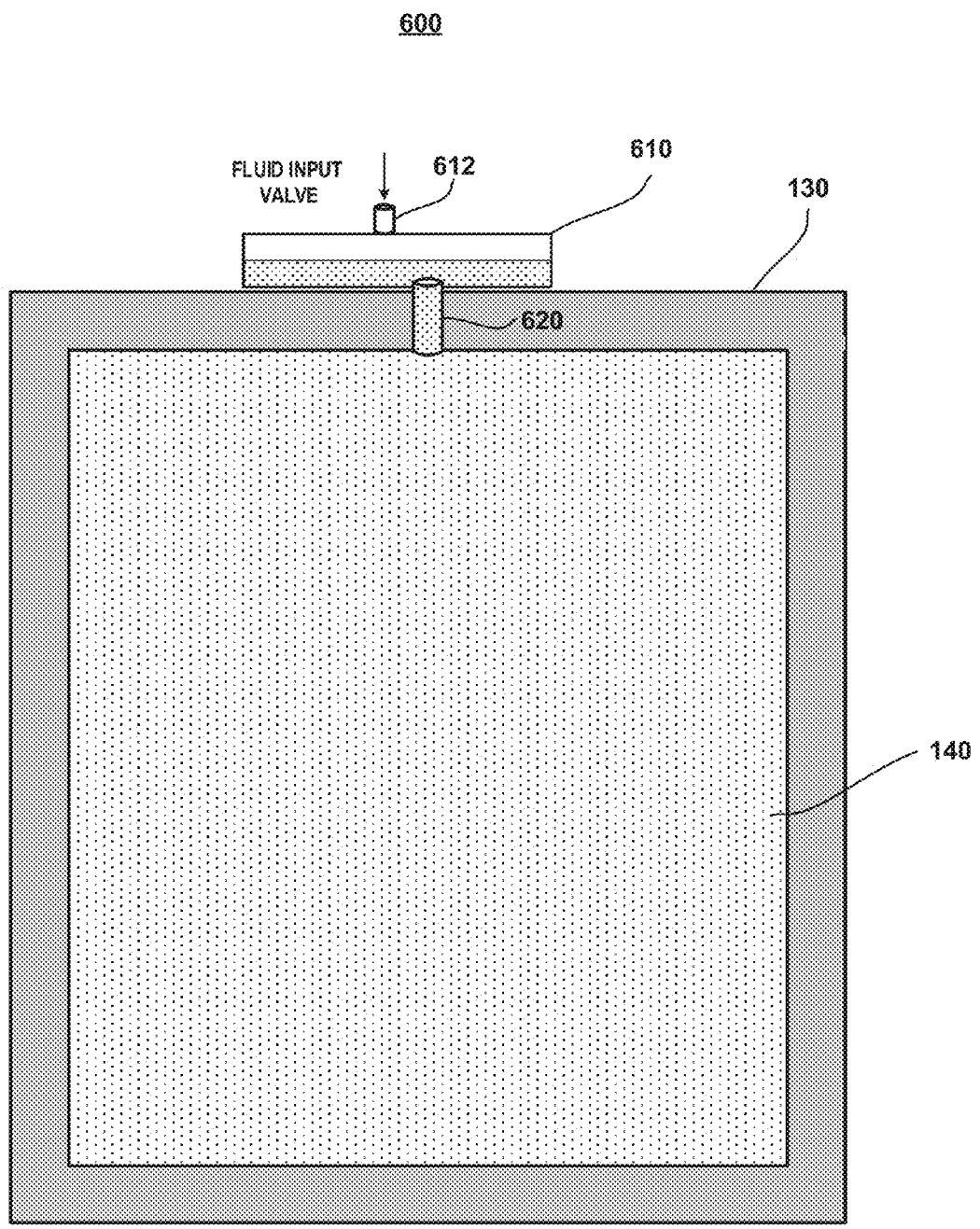
FIG. 6 schematically illustrates a method for accommodating thermal expansion of an optically clear fluid of a display device, according to yet another embodiment of the invention.

FIG. 6 schematically illustrates a method for accommodating thermal expansion of an optically clear fluid of a display device, according to yet another embodiment of the invention. In particular, FIG. 6 shows a display device 600 comprising an optically clear fluid 140 that completely fills the closed volume between the display cover and the display panel and the perimeter seal 130, but wherein the display device 600 comprises a reservoir 610 disposed adjacent to an edge of the display device 600, and a tube 620 disposed in the perimeter seal 130, which couples the reservoir 610 to the optically clear fluid 140 within display device 600. The reservoir 610 is configured to hold excess or overflowing optically clear fluid 140 that flows into the reservoir 610 through the tube 620 as a result of thermal expansion of the optically clear fluid 140. In one embodiment, the reservoir 610 further comprises a fluid input valve 612 which can be used to fill the volume between the display cover and the display panel and the perimeter seal 130 with the optically clear fluid 140 during fabrication of the display device 600.

In another embodiment, the type of optically clear fluid that is used can have a substantially zero coefficient of thermal expansion such that the volume of the optically clear fluid does not increase (or only increases an insignificant amount) with an increase in temperature of the optically clear fluid. In yet another embodiment, the type of optically clear fluid that is used can have a negative coefficient of thermal expansion such that a volume of the optically clear fluid decreases with an increase in temperature of the fluid. As such, these types of optically clear fluid materials can be used without the volume expansion mechanisms discussed above with reference to FIGS. 4, 5 and 6, as an increase in temperature of the optically clear fluid (starting from a baseline temperature of the fluid) will not result in thermal expansion of the volume of the optically clear fluid.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A display device, comprising:
   a liquid crystal display (LCD) panel;
   a display cover bonded to a perimeter of a front surface of the LCD panel with a perimeter seal, wherein the display cover comprises a first planar surface and a second planar surface opposite the first planar surface, wherein perimeter seal is disposed between the perimeter of the front surface of the LCD panel and a perimeter of the first planar surface of the display cover; and
   an optically clear fluid disposed in a gap between the front surface of the LCD panel and the first planar surface of the display cover;
   wherein the optically clear fluid is in contact with the first planar surface of the display cover and the front surface of the LCD panel, and maintained in the gap between the front surface of the LCD panel and the first planar surface of the display cover by the perimeter seal; and
   wherein no spacer elements are disposed in the gap between the front surface of the LCD panel and the first planar surface of the display cover within a region defined by the perimeter seal.

2. The display device of claim 1, wherein the optically clear fluid comprises a silicone oil.

3. The display device of claim 1, wherein the optically clear fluid comprises alcohol.

4. The display device of claim 1, wherein the optically clear fluid comprises water.

5. The display device of claim 1, wherein the optically clear fluid comprises a liquid gel.

6. The display device of claim 1, wherein the optically clear fluid comprises a material having a substantially zero coefficient of thermal expansion.

7. The display device of claim 1, wherein the optically clear fluid comprises a material having a negative coefficient of thermal expansion.

8. The display device of claim 1, wherein the optically clear fluid has an index of refraction that is substantially matched to an index of refraction of the display cover.

9. The display device of claim 1, wherein the gap has a thickness in a range of 0.1 mm to 1 inch.

10. The display device of claim 1, further comprising a piece of closed cell foam disposed within the gap, wherein the piece of closed cell foam is configured for compression in response to a compressive force applied to the piece of closed cell foam due to thermal expansion of the optically clear fluid in the gap.

11. The display device of claim 1, further comprising:
   a reservoir disposed adjacent to an edge of the display device; and
   a tube disposed in the perimeter seal, and coupling the reservoir to the optically clear fluid in the gap between the display panel and the display cover;
   wherein the reservoir is configured to hold excess or overflowing optically clear fluid that flows into the reservoir through the tube as a result of thermal expansion of the optically clear fluid.

12. The display device of claim 1, further comprising an air space disposed in the gap between the front surface of the LCD panel and the first planar surface of the display cover within the region defined by the perimeter seal to provide space for thermal expansion of the optically clear fluid.

13. A display system, comprising:
   a display device comprising:
      a liquid crystal display (LCD) panel;
      a display cover bonded to a perimeter of a front surface of the LCD panel with a perimeter seal, wherein the display cover comprises a first planar surface and a second planar surface opposite the first planar surface, wherein perimeter seal is disposed between the perimeter of the front surface of the LCD panel and a perimeter of the first planar surface of the display cover; and
      an optically clear fluid disposed in a gap between the front surface of the LCD panel and the first planar surface of the display cover;

wherein the optically clear fluid is in contact with the first planar surface of the display cover and the front surface of the LCD panel; and wherein no spacer elements are disposed in the gap between the front surface of the LCD panel and the first planar surface of the display cover within a region defined by the perimeter seal; and a temperature control system comprising a temperature control module, wherein the temperature control system is coupled to the display device and is configured to circulate the optically clear fluid of the display device through the temperature control module to control a temperature of the display device;

wherein temperature control module comprises a heat sink configured to absorb and dissipate thermal energy of the optically clear fluid which is heated by the display device and circulated away from the display device by operation of the temperature control system, and to provide cooled optically clear fluid which is circulated to the display device by operation of the temperature control system to cool the display device.

14. The display system of claim 13, wherein the temperature control system comprises:

a circulator pump;

fluid input/output connectors coupled to the display device; and a piping system coupled to the fluid input/output connectors, the circulator pump, and the temperature control module;

wherein the circulator pump is configured to circulate the optically clear fluid through the piping system, the display device, and through the temperature control module to at least one of heat and cool the optically clear fluid.

15. The display system of claim 14, wherein the temperature control module comprises a thermoelectric cooling module.

16. The display system of claim 14, wherein the temperature control module comprises a thermoelectric heating module.

17. A method for fabricating a display device, comprising:

applying a sealing material around a perimeter of a front surface of a liquid crystal display (LCD) panel;

bonding a display cover to the LCD panel using the sealing material, wherein the display cover comprises a first planar surface and a second planar surface opposite the first planar surface, wherein sealing material is disposed between the perimeter of the front surface of the LCD panel and a perimeter of the first planar surface of the display cover, and wherein the bonding results in the formation of a gap between the front surface of the LCD panel and the first planar surface of the display cover; and filling the gap between the front surface of the LCD panel and the first planar surface of the display cover with an optically clear fluid;

wherein the optically clear fluid is in contact with the first planar surface of the display cover and the front surface of the LCD panel, and maintained in the gap between the front surface of the LCD panel and the first planar surface of the display cover by the perimeter seal; and wherein no spacer elements are disposed in the gap between the front surface of the LCD panel and the first planar surface of the display cover within a region defined by the perimeter seal.

18. The method of claim 17, wherein filling the gap comprises injecting the optically clear fluid into the gap between the front surface of the LCD panel and the first planar surface of the display cover through a tube that is disposed in the sealing material.

19. The method of claim 17, wherein optically clear fluid comprises one of alcohol, water, and a liquid gel, and wherein the optically clear fluid has an index of refraction that is substantially matched to an index of refraction of the display cover.

20. The method of claim 17, wherein optically clear fluid comprises a silicone oil.

* * * * *